(12) United States Patent
Weingart et al.

(10) Patent No.: US 11,226,379 B2
(45) Date of Patent: Jan. 18, 2022

(54) METHOD FOR DETECTING THE FAULTY OPERATION OF A GAS BLOWER DRIVEN BY A DC MOTOR

(71) Applicant: ebm-papst Landshut GmbH, Landshut (DE)

(72) Inventors: Markus Weingart, Rottenburg (DE); Bernhard Simon, Regensburg (DE)

(73) Assignee: ebm-papst Landshut GmbH, Landshut (DE)

( * ) Notice: Subject to any disclaimer, the term of this patent is extended or adjusted under 35 U.S.C. 154(b) by 21 days.

(21) Appl. No.: 16/809,337

(22) Filed: Mar. 4, 2020

(65) Prior Publication Data
US 2020/0284852 A1 Sep. 10, 2020

(30) Foreign Application Priority Data
Mar. 7, 2019 (DE) .................... 10 2019 105 749.3

(51) Int. Cl.
*G01R 19/00* (2006.01)
*G01R 31/56* (2020.01)
*G01R 31/34* (2020.01)
*C03B 9/41* (2006.01)

(52) U.S. Cl.
CPC ......... *G01R 31/56* (2020.01); *G01R 19/0092* (2013.01); *G01R 31/343* (2013.01); *C03B 9/41* (2013.01)

(58) Field of Classification Search
CPC ... G01R 31/56; G01R 19/0092; G01R 31/343
See application file for complete search history.

(56) References Cited

U.S. PATENT DOCUMENTS

| 4,814,675 A | 3/1989 | Perilhon |
| 5,671,730 A * | 9/1997 | Ollila .................. A62B 18/006 128/202.22 |

(Continued)

FOREIGN PATENT DOCUMENTS

| DE | 100 13 816 A1 | 10/2001 |
| DE | 698 30 268 T2 | 1/2006 |

(Continued)

*Primary Examiner* — Alesa Allgood
(74) *Attorney, Agent, or Firm* — Harness, Dickey & Pierce, P.L.C.

(57) ABSTRACT

A method for detecting faulty operation of a gas blower driven by an electronically commutated DC motor. The DC motor of the gas blower is controlled by an integrated electronic motor control circuit. The electrical current draw, required in operation to reach a predetermined blower speed of the gas blower, is measured. It is measured as a measured variable via the electronic motor control circuit. The electronic motor control circuit performs a plausibility check of the measured electrical current draw. The measured value of the electrical current draw, at a predetermined blower speed, is compared to a current draw reference value characteristic stored in the electronic motor control circuit. Thus, a warning and/or an error code is issued by the electronic motor control circuit. The warning is based on deviation of the measured value of the electrical current draw beyond a tolerance range around the reference characteristic.

11 Claims, 3 Drawing Sheets

(56) References Cited

U.S. PATENT DOCUMENTS 6,153,993 A * 11/2000 Oomura ............... H02P 6/12
318/434
2007/0238057 A1 * 10/2007 Specht ............... F23N 3/082
431/89

FOREIGN PATENT DOCUMENTS

DE   10 2011 090 075 A1   7/2013
DE   10 2013 106 838 A1   12/2014

* cited by examiner

METHOD FOR DETECTING THE FAULTY OPERATION OF A GAS BLOWER DRIVEN BY A DC MOTOR

CROSS-REFERENCE TO RELATED APPLICATION

This application claims priority to German Application No. 10 2019 105 749.3, filed Mar. 7, 2019. The disclosure of the above application is incorporated herein by reference.

FIELD

The disclosure relates to a method for detecting faulty operation of a gas blower driven by an electronically commutated DC motor utilizing an electronic motor control circuit.

BACKGROUND

Gas blowers are used in heating systems to feed the load-dependent gas-air mixture to the heating system burner. There are a number of influencing factors that can cause the gas mixture blower to operate outside the target range.

Such influencing factors are based, in a first group, upon faults in the DC motor. For example, the faults may be incorrect commutation, reduced magnetic strength of the rotor over its lifetime, a temperature increase in the windings or the magnet, which causes a reduction in the magnetic field, or undervoltage. Contained in a second group are faults based upon increased bearing friction of the rotor, or energy dissipaters that adversely affect the impeller of the blower. A third group of influencing factors includes faults based upon changed aerodynamics, for example, due to a change in air density or a blocked suction zone or exhaust pipe.

SUMMARY

It is therefore the object of the disclosure to identify faulty operation of a gas blower due to motor-related, mechanical or aerodynamic faults via the electronic motor control circuit of the DC motor.

The object is met through a method for detecting faulty operation of a gas blower is driven by an electronically commutated DC motor. The DC motor of the gas blower is controlled by an integrated electronic motor control circuit. The electrical current draw required in operation to reach a predetermined blower speed of the gas blower is measured. A measured variable via the electronic motor control circuit is measured. A plausibility check of the measured electrical current draw by the electric motor control circuit is performed is performed. The measured value of the electrical current draw at a predetermined blower speed is compared to a current draw reference value characteristic stored in the electronic motor control circuit. Deviation of the measured value of the electrical current draw beyond a tolerance range around the reference characteristic is monitored. A warning and/or an error code is issued by the electronic motor control circuit.

According to the disclosure, a method for detecting faulty operation of a gas blower driven by an electronically commutated DC motor is proposed. The DC motor of the gas blower is controlled by an integrated electronic motor control circuit. The electrical current draw required, in operation, to reach a predetermined blower speed of the gas blower is measured. It is measured as a measured variable via the electronic motor control circuit. To achieve this, the electronic motor control circuit performs a plausibility check of the measured electrical current draw. The measured value of the electrical current draw, at a predetermined blower speed, is compared to a current draw reference value characteristic stored in the electronic motor control circuit. Thus, based on the deviation of the measured value of the electrical current draw, beyond a tolerance range around the reference characteristic, a warning and/or an error code is issued by the electronic motor control circuit. A warning may also trigger an error code.

As an alternative to the electrical current draw, it is also possible to utilize any physical value proportional to it, for example, the power of the DC motor. The electrical current draw in this instance is always the current that flows through the stator windings.

Each one of the above-described influencing factors or faults causes the DC motor electrical current draw, at a certain blower speed, to be higher or lower than a reference value that is stored in the reference value characteristic. The trend is that the motor-related faults of the first group and the mechanical faults of the second group cause an increase in the electrical current draw. The aerodynamics-based faults of the third group lead to a lowering of the electrical current draw. Thus, the deviation is classified into either exceeding or falling below the reference value characteristic. Thus, the type of fault is determined from the classification. In the instance that the reference limit of the reference characteristic is exceeded, it can be concluded that the fault is one contained in the first two groups. If the reference limit of the reference characteristic falls below, a fault from the third group concerning aerodynamics can be assumed.

The gas blower is primarily operated in different load-dependent states, but each essentially at a constant speed. The electronic motor control circuit measures the actual current draw at the respective speed, preferably continuously, and compares it to the reference value of the reference characteristic. The warning and/or error code are/is issued if the measured value of the electrical current draw, at the predetermined blower speed, exceeds or falls short of a reference value in the reference characteristic at the predetermined blower speed by a maximum deviation. The maximum deviation thus determines the tolerance range. The above consideration looks at a quasi-stationary case where the speed does not change for a certain period. In a non-stationary instance the current draw may be higher and lie outside the tolerance range since a strong dynamic of the gas blower is desirable where the impeller can accelerate quickly to higher speeds.

Furthermore in a different embodiment, the method includes the value of the electrical current draw, at the predetermined blower speed, measured over time in regular intervals or continuously. The warning and/or error code are/is only issued if the value of the electrical current draw lies outside the tolerance range, around the reference characteristic, over a predetermined period. Particularly with the types of faults concerning aerodynamics the time factor plays a significant role. This is due to that changes, for example due to dirt buildup, usually proceed slowly and the current draw required for a certain speed of the DC motor reduces correspondingly slowly. The proposed process step takes this into consideration by recording time gradients of the measured current draw. Thus, the warning and/or error code are/is only issued if the deviation to the reference characteristic is detected over a predetermined time period.

The reference characteristic is determined individually in a laboratory for each of the DC motors used. It is stored in the electronic motor control circuit. This enables the most accurate tuning of the electrical current draw to the target values.

In a further development of the method, the electronic motor control circuit has a maximum current limiting facility that is dependent on the speed of the gas blower. The current limiter compares the measured value of the electric current draw at a predetermined blower speed to an admissible maximum value. The current limiter limits the electrical current draw of the DC motor to the maximum value if the maximum value is exceeded. In the instance that the DC motor is blocked, for example, this ensures that excessive currents are avoided and the speed of the gas mixture blower is limited. The current limiter also prevents the DC motor from overheating.

In an advantageous embodiment a transmission device with an interface for transmitting the value of the electrical current draw, measured and evaluated in the electronic motor control circuit, to a heating system that is connected to the gas blower, is provided with the electronic motor control circuit. Communication and transmission of the measured and evaluated value to the heating system takes place, for example, via a bus system. It is advantageous in this instance that the electronically determined values of the electrical current draw of the DC motor, that have undergone a plausibility check or have been evaluated, can be transmitted to an external unit (heating system), which itself is controlled by a control unit. Thus the unit or heating system, respectively, is not required to have a fault detection facility itself. The control unit of the heating system is already able to access the signals or warnings and error codes supplied by the electronic motor control circuit. The application expenditure at the unit or heating system is lower.

In a further development, the method of the electronic motor control circuit comprises a readable error memory where the warnings and/or error codes of the plausibility check are stored. During maintenance, it is possible to determine which errors were recorded and stored during operation via a reader.

DRAWINGS

Other advantageous further developments of the disclosure are included in the dependent claims or are described below in greater detail by way of the figures in conjunction with the description of the preferred embodiment of the disclosure. Shown are in:

DETAILED DESCRIPTION

Figure 1:
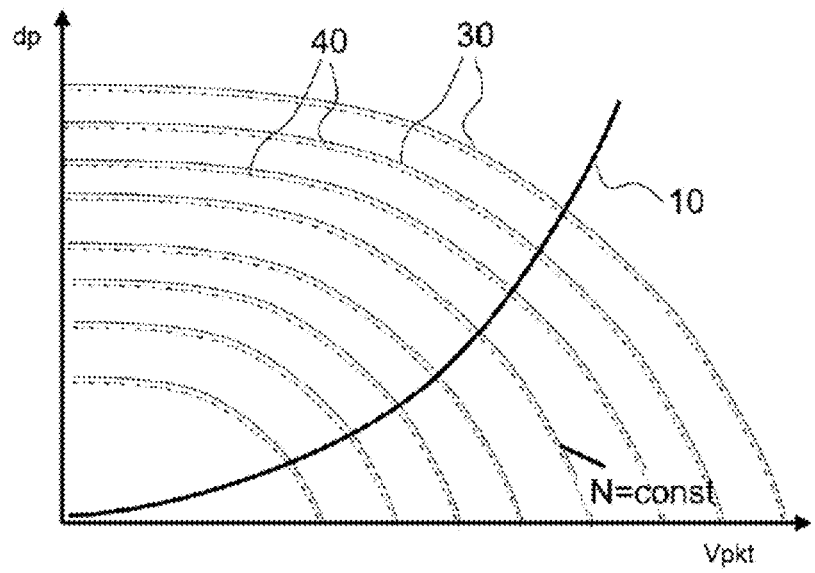
FIG. 1 is a diagram of pressure increase compared to volume flow of the gas blower with reducing air density as the fault type.
Figure 2:
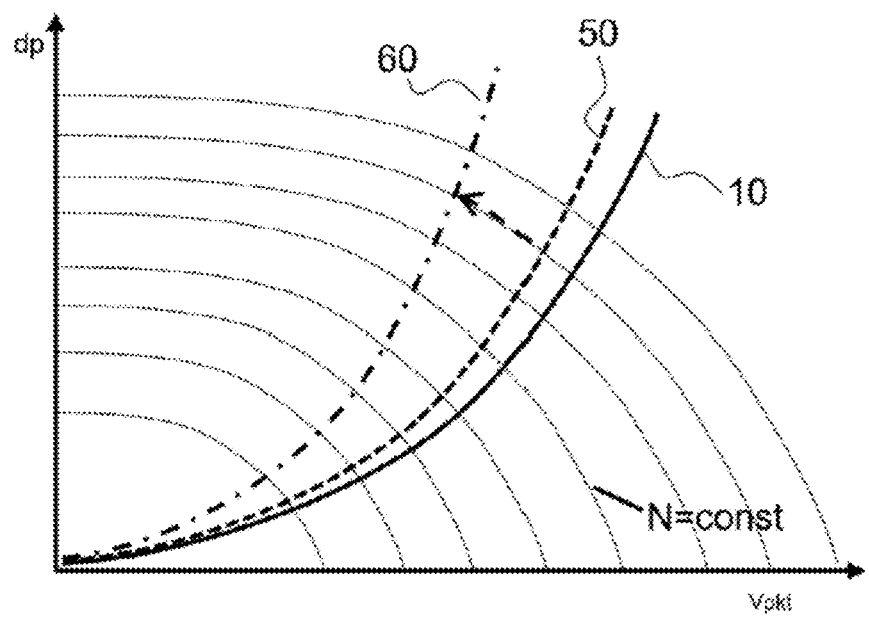
FIG. 2 is a diagram of pressure increase compared to volume flow of the gas blower with a blocked exhaust pipe as the fault type.
Figure 3:
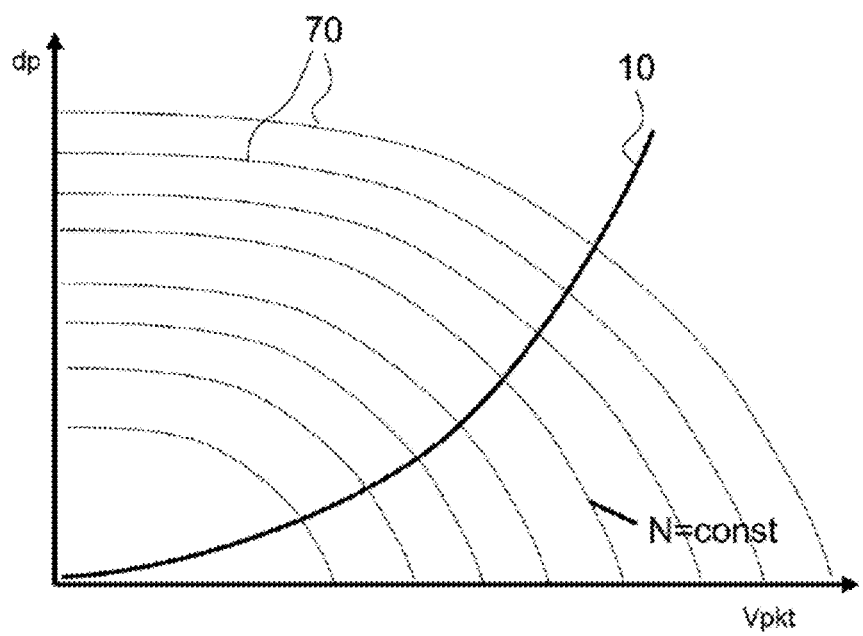
FIG. 3 is a diagram of pressure increase compared to volume flow of the gas blower with reducing efficiency factor of the DC motor as the fault type.

FIGS. 1-3 each show a diagram of the blower characteristic and the plant characteristic curve of a gas blower in the form of a radial fan with different error types as influencing values. Each shows the pressure increase dp on the Y-axis and the volume flow Vpkt on the X-axis.

As an example, FIG. 1 schematically depicts the fault type of a change in air density. The plant characteristic curve 10 (also called "system characteristic") is assumed to be constant for simplicity's sake. Moreover, the reference characteristic 30 and the characteristic of reduced air density 40 are each depicted at a constant speed N as reference values.

FIG. 2 depicts an increasing pressure loss caused by a plant-related fault, for example a blocked exhaust pipe or a dirty heat exchanger in the heating system. The nominal plant characteristic curve 10 moves left already during commissioning of the gas blower with the heating system to a lower volume flow (characteristic 50) and moves further away from the nominal plant characteristic curve 10 in operation (characteristic 60).

FIG. 3 depicts the plant as well as the environment unaffected. However, the type of fault shown, for example the reducing efficiency factor of the gas blower motor, for example through overheating. The plant characteristic curve 10 remains constant in this instance, and the reference characteristics 70 also remain unchanged at a constant speed N.

Figure 4:
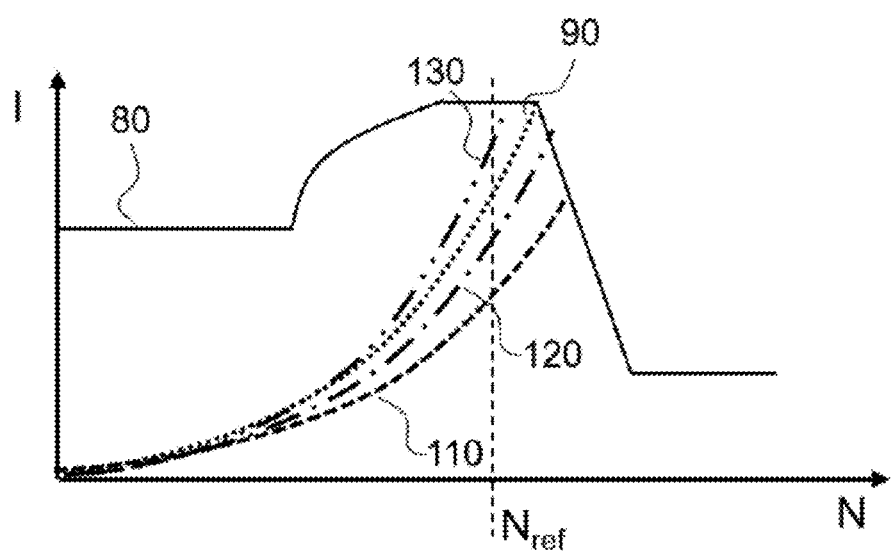
FIG. 4 is a diagram with characteristic curves for electrical current draw of the DC motor at different speeds in the fault types of FIGS. 1-3, including the reference characteristic.

The effects of the exemplary fault types depicted in FIGS. 1-3 on the current draw I of the gas blower's DC motor are shown in the diagram according to FIG. 4. The curve 80 indicates a maximum admissible current draw of the DC motor over the speed N in stationary operation, that is, during acceleration or increase of the blower speed of the gas blower. The current limiter is implemented as part of the electronic motor control circuit. The current limiter serves to prevent excessively high currents, for example if the DC motor is blocked, and to limit the speed. The stationary current draw in quasi-stationary operation at constant speed N is lower. The characteristic 90 represents a reference characteristic for this. The fault types according to FIG. 1 concerning reducing air density as well as a blocked exhaust pipe according to FIG. 2 lead to lower currents at the same speed N_ref. A heat increase of the DC motor and the resulting drop in efficiency leads to an increase in current draw at the same speed N_ref. The characteristic 110 shows the fault type according to FIG. 1. The characteristic 120 shows the fault type according to FIG. 2. The characteristic 130 shows the fault type according to FIG. 3.

Figure 5:
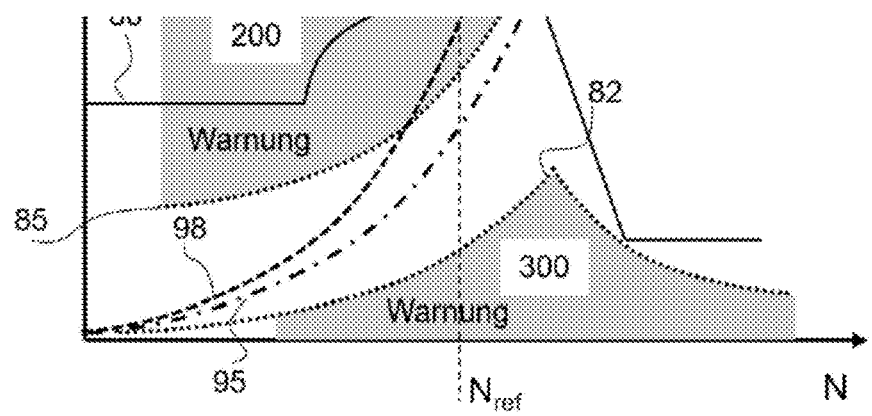
FIG. 5 is aa diagram with a characteristic curve of the electrical current draw of the DC motor with a fault type according to FIG. 3 as well as with the reference characteristic and the tolerance range in one direction.

FIG. 5 depicts a diagram with a quasi-stationary characteristic 98 of the electrical current draw I of the DC motor, as an example, in the instance of a fault according to FIG. 3 compared to the reference characteristic 95 established in the laboratory. Two characteristics 82 and 85 are shown offset from each other on either side of the reference characteristic 95. These determine the tolerance range. The area 200 with increased current draw I at constant speed N_ref and the area 300 with a comparatively lower current draw I at constant speed N_ref are outside the tolerance range. As soon as characteristics 98 and 85 intersect and the DC motor operates in the area 200 outside the tolerance range, warning and error code are issued. Only the fault type according to FIG. 3 is depicted. In the instance of a fault type according to FIG. 1 or 2 the characteristic 98 would end up in area 300. This will also trigger the issuance of a warning and/or an error code.

Figure 6:
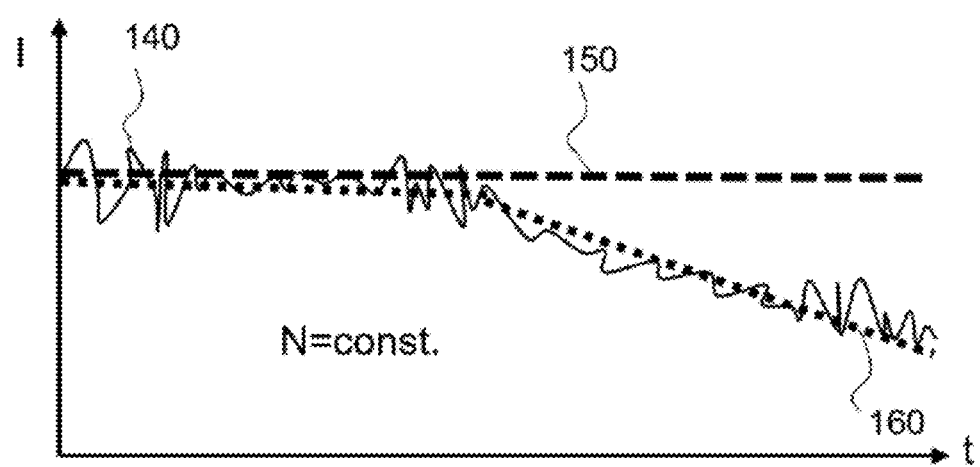
FIG. 6 is a diagram showing a schematic representation depicting the value of the current draw of the DC motor changing over time compared to a reference value.

FIG. 6 schematically shows and in an exemplary manner that the current draw value of the DC motor can change slowly over time t at constant speed N compared to a reference value. The broken line 150 depicts the reference value. The actual, continuously measured current draw 140 varies only slightly and may be within the tolerance range. However, over time it drops significantly as indicated by the averaging line 160. Warning and error code are also issued if the value of the electrical current draw is away from the reference line 150 for too long and too far.

The plausibility check and comparison with the measured electrical current draw to the reference value of the reference value characteristic takes place directly through the electronic motor control circuit of the gas blower. To facilitate this, the electronic motor control circuit also comprises a current measuring device as well as an electronic control module, in particular a comparator.

In the electronic motor control circuit the motor current (electrical current draw) is applied to an analog to digital converter (ADC) of the microcontroller parallel to the overcurrent monitoring. This is carried out by a comparator in the microcontroller. The motor current is measured with a shunt. The signal is then taken from the midpoint of the PWM cycle (PWM=Pulse Width Modulation) and converted. The DC link voltage is also measured, if required, and is used to calculate the motor power with the motor current.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for detecting faulty operation of a gas blower driven by an electronically commutated DC motor comprising:
   providing the DC motor of the gas blower controlled by an integrated electronic motor control circuit;
   measuring electrical current draw required in operation to reach a predetermined blower speed of the gas blower;
   performing a plausibility check of the measured electrical current draw by the electric motor control circuit;
   comparing (a) the measured value of the electrical current draw at the predetermined blower speed to (b) a current draw reference value characteristic at the predetermined blower speed stored in the electronic motor control circuit;
   monitoring deviation of the measured value of the electrical current draw beyond a tolerance range around the reference characteristic; and
   issuing at least one of a warning and an error code by the electronic motor control circuit based on the deviation being beyond the tolerance range around the reference value characteristic.

2. The method according to claim 1, further comprising issuing the at least one of the warning and an error code if the measured value of the electrical current draw at the predetermined blower speed exceeds or is less than the reference value characteristic at the predetermined blower speed by a predefined maximum deviation.

3. The method according to claim 1, further comprising classifying the deviation into either exceeding or being less than the reference value characteristic, and determining a type of fault from the classification.

4. The method according to claim 1, further comprising measuring the value of the electrical current draw at the predetermined blower speed over time in regular intervals or continuously, and issuing the at least one of the warning and the error code only if the value of the electrical current draw lies outside the tolerance range, around the reference value characteristic, over a predetermined period.

5. The method according to claim 1, further comprising determining the reference characteristic individually in a laboratory for the DC motor used and storing the reference characteristic in the electronic motor control circuit.

6. The method according to claim 1, wherein the electronic motor control circuit has a maximum current limiting device that is dependent on the speed of the gas blower, and comparing the measured value of the electric current draw at the predetermined blower speed to an admissible maximum value, and limiting the electrical current draw of the DC motor to the maximum value if said maximum value is exceeded.

7. The method according to claim 1, wherein the electronic motor control circuit comprises a readable error memory where at least one of issued warnings and issued error codes of the plausibility check are stored.

8. The method according to claim 1, further comprising providing a transmission device with an interface for transmitting the at least one of the warning and the error code to a heating system, which is connected to the gas blower, in the electronic motor control circuit, and the interface transmitting the value of the electrical current draw, which was measured in the electronic motor control circuit and evaluated by the plausibility check, to the heating system connected to the gas blower.

9. The method according to claim 8, further comprising transmitting the at least one of the warning and the error code to the heating system.

10. The method according to claim 1, wherein the electronic motor control circuit comprises a current measuring device and an electronic control module.

11. The method of claim 10 wherein the electronic motor control circuit comprises at least one of a comparator and an integrated circuit (IC) control module.

* * * * *